United States Patent [19]

Maniar

[11] Patent Number: 5,186,745
[45] Date of Patent: Feb. 16, 1993

[54] TEOS BASED SPIN-ON-GLASS AND PROCESSES FOR MAKING AND USING THE SAME

[75] Inventor: Papu D. Maniar, Austin, Tex.

[73] Assignee: Motorola, Inc., Schaumburg, Ill.

[21] Appl. No.: 650,119

[22] Filed: Feb. 4, 1991

[51] Int. Cl.⁵ .......................... C09D 183/06
[52] U.S. Cl. .................. 106/287.16; 501/12
[58] Field of Search ............... 501/12; 106/287.16

[56] References Cited

FOREIGN PATENT DOCUMENTS 53-147730 12/1978 Japan ............... 106/287.16

OTHER PUBLICATIONS

CA107(6): 50440s, Fairchild Semiconductor Corp., 1987.

Primary Examiner—Theodore Morris
Assistant Examiner—David M. Brunsman
Attorney, Agent, or Firm—Patricia S. Goddard

[57] ABSTRACT

In on form, a TEOS based spin-on-glass is made having on the order of 10% to 25% by volume of tetraethylorthosilicate, the equivalent of on the order of 0.1% to 3.0% by volume of 70% concentrated nitric acid, on the order of 60% to 90% by volume of alcohol, and the balance water. The spin-on-glass is applied to a semiconductor substrate and heated in order to densify the spin-on-glass.

9 Claims, 2 Drawing Sheets

TEOS BASED SPIN-ON-GLASS AND PROCESSES FOR MAKING AND USING THE SAME

TECHNICAL FIELD OF THE INVENTION

The present invention relates to spin-on-glasses in general, and more specifically, to tetraethylorthosilicate (TEOS) based spin-on-glasses and processes for making and using the same.

BACKGROUND OF THE INVENTION

Spin-on-glasses (SOGs) are known materials used in the fabrication of semiconductor devices. SOGs are primarily used to planarize a semiconductor wafer, but are also used as interlayer dielectrics, passivation layers, and sacrificial etch-back layers. As the name "spin-on-glasses" suggests, SOGs are deposited onto a semiconductor substrate and the substrate is spun at high speeds to distribute the SOG uniformly across the substrate surface. SOGs are initially in a viscous liquid state, which allows the SOG to fill any open spaces, crevices, or voids which might be on the substrate surface. The coated substrate is then baked to remove water and solvents and to densify the SOG into a solid, glass-like film.

Conventional SOGs can be classified into two general categories, silicate SOGs and siloxane SOGs. Silicate SOGs are polymer networks containing primarily Si-O bonds. Silicate SOGs have an advantage of forming highly pure $SiO_2$ films, without organic contaminants. A disadvantage associated with silicate SOGs is that upon baking, the films shrink considerably, creating high stresses in the films and in an underlying substrate. Another disadvantage is that silicate SOGs have poor step coverage, or in other words do not planarize uniformly or sufficiently. For example, a silicate SOG may planarize a small space between two structures, but as the size of the space increases the planarization capability is reduced. Siloxane SOGs, on the other hand, are polymer networks containing Si-O bonds and either Si-C bonds or Si-O-C bonds. Siloxane SOGs are an improvement in that siloxane SOGs shrink less upon baking and provide better step coverage than silicate SOGs. However, siloxane SOGs have a disadvantage of having a high organic content due to the presence of Si-C and Si-O-C bonds. The presence of organics in a SOG is unfavorable because organics can contaminate the film and affect performance and reliability of the film. While some of the organics can be removed by baking the film at higher temperatures or for longer periods of time, these remedies are also unfavorable because stresses in the film are consequently increased.

In an effort to improve planarization capabilities of SOGs, semiconductor manufacturers have used several techniques. One technique used is to apply a very thick SOG film. However, very thick films have a greater tendency to crack at points of high stress, particularly upon baking. Another technique is to apply multiple, thin SOG films to improve planarity without experiencing cracking problems. While several thin films can improve planarity with greater resistance to cracking, using multiple films significantly increases manufacturing time. In addition, multiple layer films tend to peel due to poor adhesion between the various layers. Another way to improve crack resistance of a SOG is to add dopants, such as boron or phosphorus, to the film. The bonding structure of a doped SOG seems to improve film strength, thereby reducing the susceptibility to cracking. However, there are applications in semiconductor devices in which doping a SOG is not appropriate.

Therefore a need exists for an improved spin-on-glass (SOG), and more specifically for an improved SOG for use in semiconductor fabrication which contains essentially no organics, provides good step coverage with minimal shrinkage after baking, is resistant to cracking, and can planarize sufficiently with one or more application.

BRIEF SUMMARY OF THE INVENTION

The previously mentioned disadvantages of conventional spin-on-glasses are overcome with the present invention. In one form, a tetraethylorthosilicate (TEOS) based spin-on-glass is used to fabricate a semiconductor device. A spin-on-glass having a composition of:

a) on the order of 10% to 25% by volume of tetraethylorthosilicate;
b) on the order of 0.1% to 3.0% by volume of the equivalent of 70% nitric acid;
c) on the order of 60% to 90% by volume of alcohol; and
d) balance water; is deposited onto a semiconductor substrate. The semiconductor substrate is heated to densify the spin-on-glass.

DETAILED DESCRIPTION OF A PREFERRED EMBODIMENT

Spin-on-glasses (SOGs) are commonly used in semiconductor device fabrication as planarization, passivation, or interlayer dielectric layers. Although the used of SOGs is relatively widespread, there are several disadvantages with commercially available SOGs. Silicate SOGs, for example, do not planarize sufficiently and create large stresses in a semiconducting substrate due to a high degree of shrinkage. The more widely used siloxane SOGs have improved step coverage and reduced stress, but have a disadvantage of containing organics which can affect performance and reliability of a semiconductor device. In addition, siloxane SOGs decompose easily and have a tendency to absorb water. The present invention overcomes these problems by using a TEOS based SOG containing tetraethylorthosilicate (TEOS), nitric acid, isopropyl alcohol, and water in a specified range of concentrations.

Figure 1:
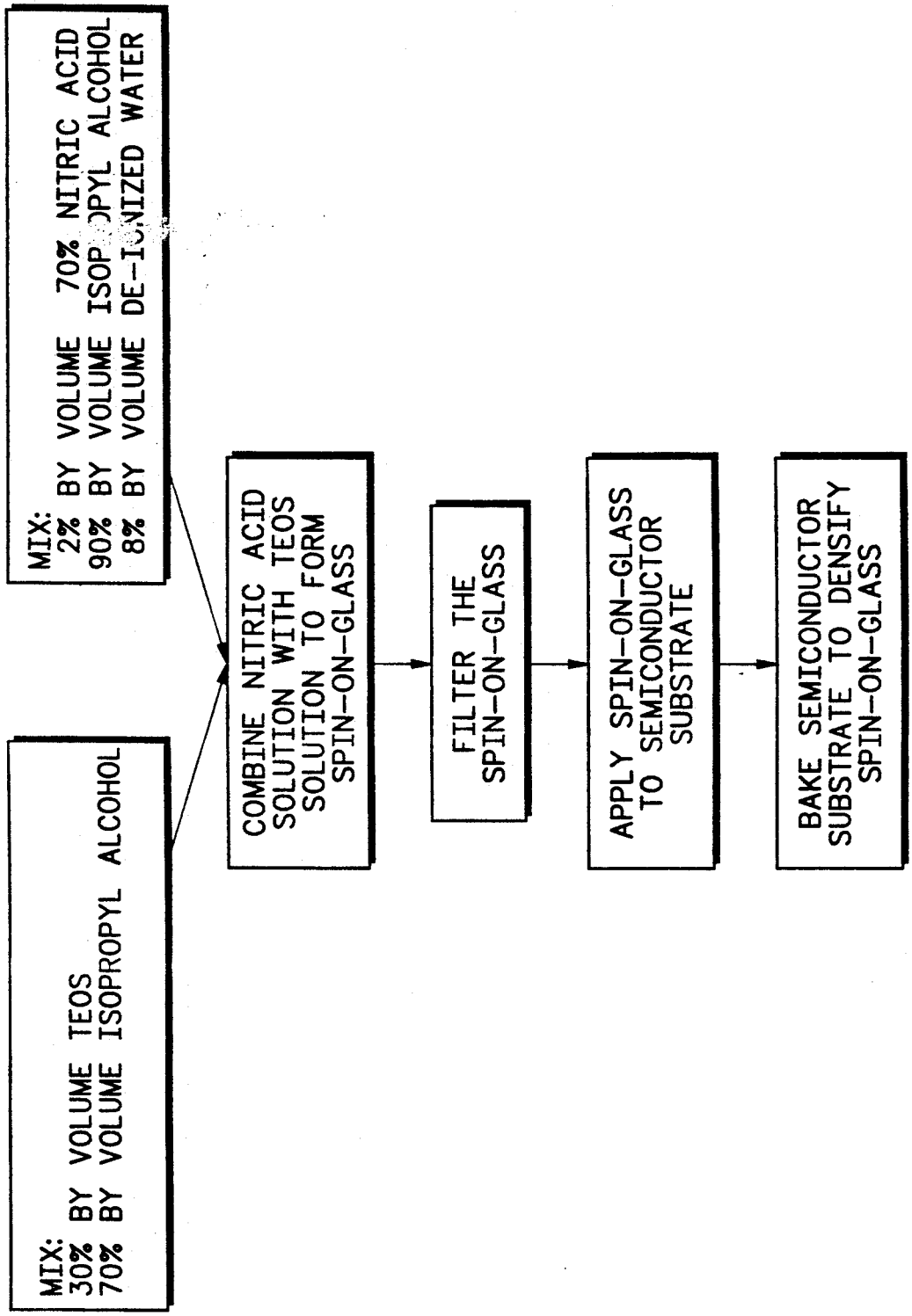
FIG. 1 is a process flow for making and using a TEOS based spin-on-glass in accordance with the present invention.

Illustrated in FIG. 1 is a process flow for making and using a TEOS based SOG in accordance with the present invention. It is important to note that the volume percentages of FIG. 1 are examples of percentages in accordance with the invention. Variations to these percentages can be made and still be within the scope of the invention. To form the TEOS based SOG, two separate solutions are prepared. One solution is a dilute TEOS solution which is made by mixing TEOS (tetraethylorthosilicate) with 65-75% by volume alcohol, for instance isopropyl alcohol. The other solution is a dilute nitric acid solution which is formed by mixing the equivalent of 70% (by weight) concentrated nitric acid with 85-95% by volume alcohol and 6-10% by volume de-ionized water. While each of the above mentioned ranges are suitable, more preferred ranges are as follows: diluting TEOS with 68-70% by volume alcohol and diluting 70% nitric acid with 7.5-9.0% de-ionized water and 89-91% alcohol. Both of the nitric acid solution and TEOS solution are simply dilutions; therefore, it is not necessary to allow the solutions to react. The dilute TEOS solution and the dilute nitric acid solution are then combined in a 1:1 to 1:2 ratio, or more preferably in a ratio of 1:1.2 to 1:1.4, and thoroughly mixed, thereby forming a TEOS based SOG in accordance with the invention. In forming the SOG, it is important that two separate solutions, namely the dilute TEOS solution and the dilute nitric solution, be prepared individually and then combined. Simply mixing all the ingredient will not result in a material suited for use as a spin-on-glass having the properties herein described.

According to the volume percentages of the dilute TEOS solution and the dilute nitric solution, the resulting SOG has a composition of approximately 15-22% TEOS, 0.2-1.3% concentrated nitric acid, 70-90% alcohol, and the balance being water. Other suitable compositions of the inventive SOGs range from 10-25% TEOS, 0.1-3.0% concentrated nitric acid, 60-90% alcohol, and the balance being water. Preferred compositions of a TEOS based spin-on-glass in accordance with the present invention fall in the ranges of 16.8-19% TEOS, 0.4-1.1% concentrated nitric acid, 74.5-81.5% alcohol, and the balance being water. All of the mentioned percentages are percentages by volume. The true chemical formula of the SOG cannot readily be determined.

Continuing with the process flow illustrated in FIG. 1. the resulting SOG is filtered prior to application on a substrate in order to remove particulates which may be present. Particulates can easily be removed through a 0.2 micron filter, resulting in a very clean SOG. Larger or smaller filters can be used, depending on the desired purity of the SOG. The filtered SOG is then ready for application onto a substrate, such as a semiconductor wafer. Conventional application techniques are used to apply the SOG to the wafer. A predetermined amount of the SOG is deposited in approximately the center of the wafer. The wafer is then spun to distribute the SOG evenly across the wafer surface. After spinning, the wafer is baked in a traditional manner, for instance using hot plate bakes or oven bakes ranging from 100°-300° C. Baking the wafer drives off water and solvents in the film and converts the SOG to a solid. Additional bakes or anneals may also be required, depending on the application for which the SOG is to be used.

EXAMPLES

To illustrate the remarkable properties of TEOS based SOGs in accordance with the present invention, two samples were made according to the mixtures described in the table below:

|  | SOG A Volume % | SOG B Volume % |
|---|---|---|
| TEOS Solution |  |  |
| TEOS | 31.3 | 31.3 |
| Isopropyl Alcohol | 68.7 | 68.7 |

|  | SOG A Volume % | SOG B Volume % |
|---|---|---|
| Nitric Acid Solution |  |  |
| 70% Nitric Acid | 2.2 | 1.1 |
| Isopropyl Alcohol | 89.8 | 90.3 |
| De-Ionized Water | 8.0 | 8.6 |

Each of the TEOS solutions and nitric acid solutions of SOG A and SOG B were made separately, as required by the invention. The respective TEOS solutions and nitric acid solutions were then mixed in a ratio of 1:1.2 to 1:1.4 to form SOGs A and B. The approximate total volume percentages of SOGs A and B are as follows:

|  | SOG A Tot. Vol. % | SOG B Tot. Vol. % |
|---|---|---|
| TEOS | 17.9 | 18.0 |
| Isopropyl Alcohol | 77.7 | 77.9 |
| $HNO_3$ (70%) | 1.0 | 0.5 |
| Water | 3.4 | 3.6 |
|  | 100.0 | 100.0 |

Each SOG was filtered through a 0.2 micron filter to remove particulates. SOGs A and B were then deposited and spun over semiconductor wafers having various topographies. Other process parameters, including spin speed, baking time, baking temperature, and the number of SOG coats applied, were varied to understand the full range of properties of the SOGs.

Experiments conducted with the SOG A and SOG B provided valuable information on the properties of these films. It was demonstrated that the SOGs can be deposited with thicknesses up to 1.5 microns without cracking. Moreover, SOG thicknesses of 1.5 microns did not exhibit cracking after a 30 minute anneal at 850° C. The planarity of the SOG films was excellent with less than 3 percent variation in film thickness across the wafer surface. Nearly global planarization was achieved across the entire wafer, including spaces ranging from 0.5-64 microns in width which were located between metal lines. SOG A and SOG B were both above to be applied in multiple coatings without peeling or cracking throughout processing operations, including an 850° C. anneal. Furthermore, anneals at 850° C. and below resulted in a film thickness reduction of less than 5 percent. As discussed earlier, many conventional SOGs shrink upon baking, thereby creating high stresses in the SOG film and in the underlying semiconductor substrate. SOGs formed and deposited in accordance with the present invention have a minimal reduction in film thickness and minimal stress.

Figure 2:
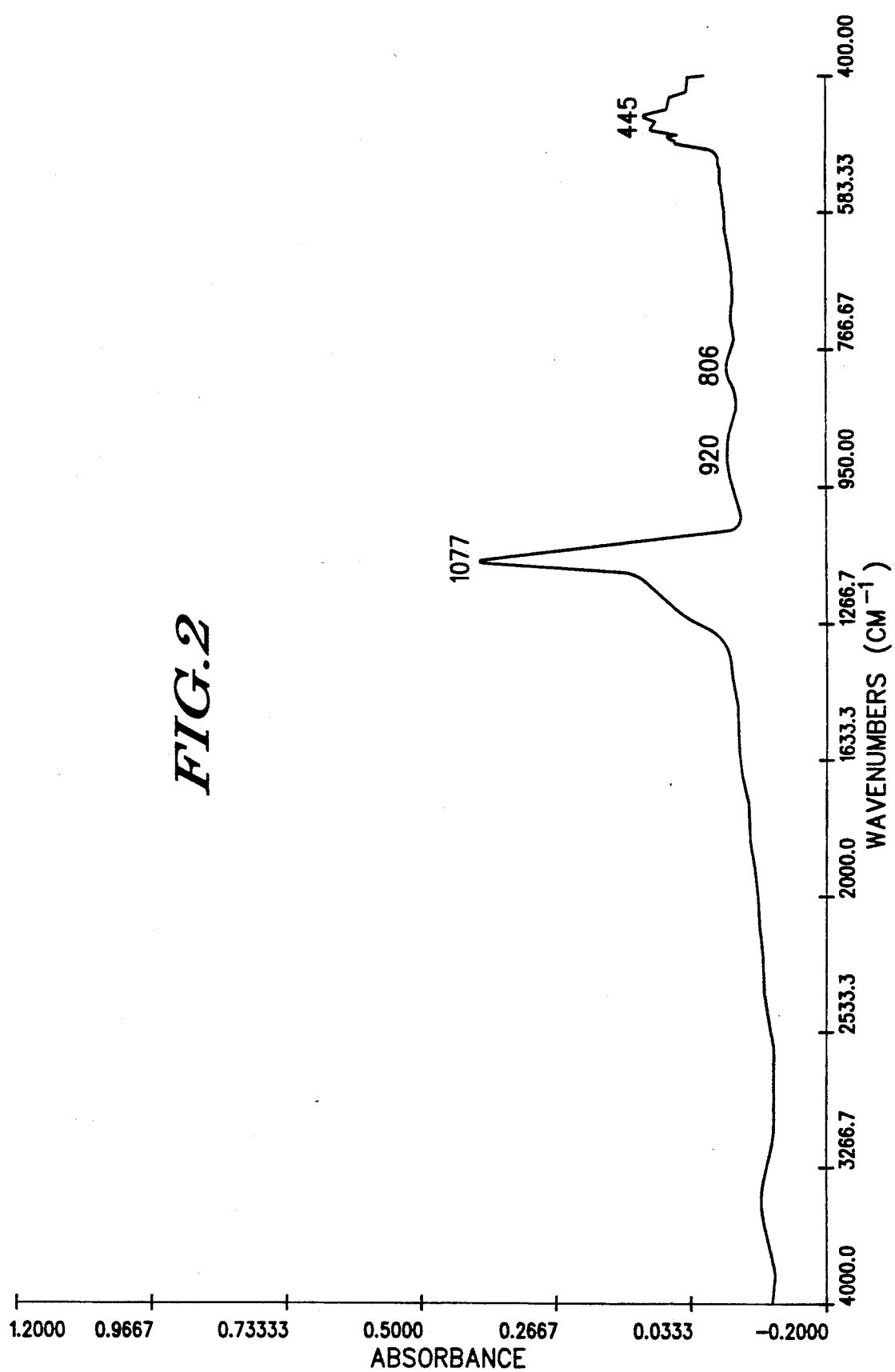
FIG. 2 is a FTIR (Fourier transform infrared) spectra which is representative of a low temperature annealed spin-on-glass formed in accordance with the present invention.

Illustrated in FIG. 2 is an FTIR (Fourier transform infrared) spectra of SOG A prior to a high temperature anneal. An FTIR spectra provides useful information about the types of chemical bonds present in a material. A particular type of chemical bond has a unique corresponding wavenumber. For example, the FTIR spectra of FIG. 2 illustrates a peal at an approximate wavenumber of 1077 ($cm^{-1}$). This wavenumber corresponds to an abundance of Si-O bonds. Recall from the background discussion that all SOGs have Si-O bonds. FIG. 2 does not illustrate any peaks in the range of wavenumbers from 1470-2950 ($cm^{-1}$). Selected peaks in this range represent the presence of C-H bonds, thus implying that the material being tested contains organic compounds. Since there are no peaks in this range, SOG A contains an undetectable amount of organics. Negligible organic content is an advantage because organics contaminate the film and can affect the performance and functionality of the film and of a semiconductor device containing the film. It is important to note that other SOGs made and used in accordance with the present invention have similar FTIR data.

As mentioned in the foregoing discussion, most conventional SOGs lose a significant amount of material thickness upon curing. Furthermore, conventional SOGs are limited by a maximum thickness which is usually about 0.5 microns. SOGs in accordance with the present invention do not have these shortcomings. For example, SOG A as described earlier demonstrated minimal shrinkage in film thickness. SOG A was deposited onto substrates and spun at 6000 rpm. The films were cured on a hot plate at 300° C. for 1 minute, resulting in a deposited single film thickness of 1,000–1,300 Å. In total, five coats were applied to the substrates to achieve film thicknesses in the range of 5,700–6,100 Å. The substrates were annealed at various temperatures and the final film thicknesses were measured. The results are shown in the table below:

| Temp. (°C.) | Anneal Condition | Final Thickness (Å) | Thickness Lost (%) |
|---|---|---|---|
| 300° | hot plate, 1 minute | 5,900 ± 200 | — |
| 400° | air, 30–60 minutes | 5,850 ± 200 | 0.9 |
| 850° | air, 30 minutes | 5,600 ± 150 | 5.1 |
| 1100° | steam, 10 minutes | 4,850 ± 150 | 17.8 |

The results demonstrate that SOG A has minimal thickness loss in comparison to conventional SOGs, losing only 5 percent in thickness after an 850° C. anneal. Although almost 18 percent of the film thickness was lost after an 1100° C. anneal, this particular film was annealed in steam which substantially increases thickness loss. Furthermore, results proved that SOGs in accordance with the invention can be applied in multiple coatings without peeling and cracking. The SOGs also demonstrated that thicknesses of up to 1.5 microns did not crack and provided nearly global planarization across the substrate surface.

There are other characteristics of the present invention which are worth noting. The TEOS based SOGs made and used in accordance with the invention are stable and insensitive to the environment. In other words, the SOGs can be exposed to the environment for long periods of time without degradation. Existing SOGs typically have a shelf-life of approximately 3–12 months at room temperature while stored in air-tight containers. Exposure to air usually degrades the characteristics of the material. SOGs which are part of the present invention have exhibited extended room-temperature shelf-lives in completely open containers without degradation. Another uncommon characteristic of a SOG formed in accordance with the present invention is that the SOG is very acidic, well below a pH of 2. It is believed that the pH of the SOG is less than 0; however, the true pH is not readily determinable with conventional water based pH indicators. Having such a low pH is thought to be advantageous because the SOG has properties which are typically characteristic of colloidal solutions without having large particles. However beyond a certain acid concentration, large particles being to form which make the material inappropriate for use as a spin-on-glass.

Overall, the present invention provides distinct advantages over existing spin-on-glasses and their known applications. The present invention permits a SOG to be deposited very thick without cracking and has minimal loss of thickness after cure. Furthermore, the present invention provides uniform planarity and can planarize very large spaces. Another significant advantage is that a SOG made and used in accordance with the invention has a negligible organic content. These features create a variety of potential applications. For example, a TEOS based SOG made and used in accordance with the present invention can be used as a very planar interlayer dielectric, without the need for a subsequent etch-back. The SOG can also be used as a passivation layer, particularly if upon exposure to a nitrogen plasma the SOG can be converted to a silicon oxy-nitride. Another application is for trench filling. To improve packing density of an integrated circuit, many semiconductor manufacturers use trenches to build elements such as transistors and capacitors. These trenches must eventually be filled to become planar with the rest of the semiconductor wafer before subsequent processing steps are performed. The reported properties of the present invention make the inventive SOG an excellent material for filling trenches in a semiconductor device. Yet another application for the present invention is as an alternative to PSG (phophosilicate glass) or BPSG (boron dopes PSG). By doping the TEOS used in the present invention, the resulting TEOS based SOG will be doped and can function as conventional PSG and BPSG layers in a semiconductor device.

Thus it is apparent that there has been provided, in accordance with the invention, a TEOS based spin-on-glass and processes for making and using the same, that fully meet the advantages set forth previously. Although the invention has been described and illustrated with reference to specific embodiments thereof, it is not intended that the invention be limited to these descriptive embodiments. Those skilled in the art will recognize that modifications and variations can be made without departing from the spirit of the invention. For example, the invention is not limited to using 70% nitric acid. Any equivalent volume of nitric acid is suitable for use with the invention. Therefore, it is intended that this invention encompass all such variations and modifications as fall within the scope of the appended claims.

I claim:

1. A tetraethylorthosilicate based spin-on-glass composition consists essentially of:
    a) between approximately 15% to 22% by volume of tetraethylorthosilicate;
    b) an amount of nitric acid equivalent to between approximately 0.2% to 1.3% by volume of 70% by weight nitric acid;
    c) between approximately 70% to 85% by volume of alcohol; and
    d) balance water, not to exceed 10% by volume of the composition.

2. The spin-on-glass composition of claim 1 wherein the alcohol consists essentially of isopropyl alcohol.

3. The spin-on-glass composition of claim 1 further characterized by the composition consists essentially of:
    a) between approximately 16.8% to 19.0% by volume of tetraethylorthosilicate;

b) an amount of nitric acid equivalent to between approximately 0.4% to 1.1% by volume of 70% by weight nitric acid;

c) between approximately 74.5% to 81.5% by volume of isopropyl alcohol; and d) balance water, not to exceed 5% by volume of the composition.

4. A process for forming a tetraethylorthosilicate based spin-on-glass comprising the steps of:

forming a dilute nitric acid solution consists essentially of between approximately 6% to 10% by volume of de-ionized water, between approximately 85% to 94% by volume of alcohol, and balance concentrated nitric acid;

forming a dilute tetraethylorthosilicate solution consists essentially of between approximately 65% to 75% by volume of alcohol and balance tetraethylorthosilicate; and adding the dilute nitric acid solution to the dilute tetraethylorthosilicate solution in a ratio of between approximately 1:1 to 1:2 to form a spin-on-glass.

5. The process of claim 4 wherein the step of forming a dilute nitric acid solution comprises forming a dilute nitric acid solution consists essentially of between approximately 85% to 94% by volume of isopropyl alcohol.

6. The process of claim 4 wherein the step of forming a dilute tetraethylorthosilicate solution comprises forming a dilute tetraethylorthosilicate solution consists essentially of between approximately 65% to 75% by volume of isopropyl alcohol.

7. The process of claim 4 wherein the step of forming a dilute nitric acid solution comprises forming a dilute nitric acid solution with 70% by weight nitric acid.

8. A process for forming a tetraethylorthosilicate based spin-on-glass comprising the steps of:

forming a dilute nitric acid solution consists essentially of between approximately 7.5% to 9.0% by volume of de-ionized water, between approximately 89% to 91% by volume of isopropyl alcohol, and balance nitric acid;

forming a dilute tetraethylorthosilicate solution consists essentially of with on the order between approximately 68% to 70% by volume of isopropyl alcohol and balance tetraethylorthosilicate; and adding the dilute nitric acid solution to the dilute TEOS solution in a ratio of between approximately 1:1.2 to 1:1.4 to form a spin-on-glass.

9. The process of claim 8 wherein the step of forming a dilute nitric acid solution comprises forming a dilute nitric acid solution with 70% by weight nitric acid.

* * * * *